United States Patent [19]

Röschmann

[11] Patent Number: 4,746,866
[45] Date of Patent: May 24, 1988

[54] HIGH-FREQUENCY COIL SYSTEM FOR A MAGNETIC RESONANCE IMAGING APPARATUS

[75] Inventor: Peter K. H. Röschmann, Hamburg, Fed. Rep. of Germany

[73] Assignee: U.S. Philips Corporation, Tarrytown, N.Y.

[21] Appl. No.: 926,475

[22] Filed: Nov. 3, 1986

[30] Foreign Application Priority Data

Nov. 2, 1985 [DE] Fed. Rep. of Germany ....... 3538952

[51] Int. Cl.⁴ ............................................ G01R 33/20
[52] U.S. Cl. .................................... 324/318; 324/322
[58] Field of Search .............. 324/318, 322; 333/222, 333/226, 223, 224, 225, 206, 207, 219, 235; 334/65, 66, 68, 69; 343/791

[56] References Cited

U.S. PATENT DOCUMENTS

| | | | |
|---|---|---|---|
| 2,492,404 | 12/1949 | Streib et al. | 343/791 |
| 4,607,224 | 8/1986 | Codrington | 324/318 |
| 4,634,980 | 1/1987 | Misic et al. | 324/318 |
| 4,667,160 | 5/1987 | Krause | 324/318 |

*Primary Examiner*—Stewart J. Levy
*Assistant Examiner*—Louis M. Arana
*Attorney, Agent, or Firm*—Algy Tamoshunas

[57] ABSTRACT

The invention relates to a high-frequency coil system for a magnetic resonance imaging apparatus, which coil system is formed by one or more systems of conductors. The system of conductors includes an outer conductor in which there is arranged a dielectric. Two inner conductors are arranged, in the dielectric. At least one of the inner conductors is displaceable and they are interconnected at least for high-frequency. The system of conductors is tuned or readjusted by displacement of one of the inner conductors.

16 Claims, 6 Drawing Sheets

HIGH-FREQUENCY COIL SYSTEM FOR A MAGNETIC RESONANCE IMAGING APPARATUS

The invention relates to a high-frequency coil system for a magnetic resonance imaging apparatus, comprising a system of conductors. High-frequency coil systems of this kind are known inter alia from European Patent Application Nos. 82107332 and 84201869 and serve to generate a high-frequency magnetic field in a body and/or to receive a high-frequency magnetic field generated in a body. The high-frequency coil system must be tuned to the so-called Larmor frequency which is proportional to the intensity of a uniform, steady magnetic field generated in the magnetic resonance imaging apparatus and which, moreover, depends on the type of nuclei whose spin resonance must be observed. In a magnetic resonance imaging apparatus involving a steady magnetic field of 2T, this frequency amounts to approximately 85 MHz for the hydrogen protons which are most commonly examined.

For tuning of the known high-frequency coil systems use is made of adjusting members having an adjustable capacitance, for example variable capacitors or short-circuited or open conductor segments which are connected parallel to the high-frequency coil system or part thereof.

It is the object of the present invention to provide a high-frequency coil in which the adjusting member is integrated in the system of conductors itself.

This object is achieved in accordance with the invention in that the system of conductors includes an outer condutor which encloses a dielectric and which has a hollow-cylindrical cross-section and two coupling apertures. Inside the dielectric there is arranged two at least partly displaceable inner conductors which are interconnected at least for high-frequency only at the area of the coupling aperture. The high-frequency signals are applied to and derived from the outer conductor and one of the inner conductors so that a high-frequency current will flow via the outer conductor and therefrom, via at least one of the capacitance formed by an inner conductor and the outer conductor, to the inner conductor.

The high-frequency coil system is tuned in that at least one of the displaceable inner conductors is suitably displaced, thus varying the capacitance between inner and outer conductors and hence the resonant frequency of the system of conductors. The capacitance, however, depends not only on the position of the inner conductor, but also on the thickness thereof, on the inner diameter of the outer conductor, and on the relative dielectric constant of the dielectric. When these parameters are suitably chosen, the tuning range can be adapted to the relevant requirements, without the need to modify the external dimensions of the system of conductors.

A high-frequency coil may consist of a pluralitiy of such systems of conductors. However, the resonant frequency of the high-frequency coil system will still be determined by the resonant frequency of the individual systems of conductors.

There are various possibilities for interconnecting the two inner conductors at least for high frequency. In one arrangement, the two inner conductors project from the ends of the outer conductor which form the coupling apertures and are interconnected via an electrically conductive shield. The electrically conductive shield, however, may also interconnect the inner conductors of a plurality of systems of conductors wherethrough the high-frequency current flows in the same direction. The variation in space of the high-frequency magnetic field can be accurately adapted to a variety of requirements by a suitable choice of the shape of the electrically conductive shield, the distance between the system (systems) of conductors and the shield, and the distance between the systems of conductors.

High-frequency coil systems having very high quality factors (typical values of between 1000 and 1500 when use is made of copper tubes for the outer conductor and copper foils for the shield) can thus be realized. For the typical distances of from approximately 5 cm to 10 cm between the outer conductor or the outer conductors and the shield, such a coil system will have comparatively small inductances and comparatively high capacitances. Therefore, comparatively small electric field strengths will occur, and hence comparatively small dielectric losses, when the patient is situated within the operating field of the coil.

The high-frequency (and conductive) connection of the inner conductors is realized via the electrically conductive shield in the above embodiment. The coupling apertures of the outer conductor are then usually formed by the two ends of the outer conductor wherefrom the inner conductors project.

However, it is alternatively possible to form a current loop which is closed for high-frequency by means of one or more systems of conductors. In one such arrangement, the system of conductors forms a preferably rectangular frame. The coupling apertures are situated in the immediate vicinity of one another, and the ends of the inner conductors projecting from the coupling aperture are conductively interconnected. Thus, only a single, bent system of conductors is used. Another possibility consists in that the inner conductors of a first system of conductors are interconnected via the inner conductors of a second system of conductors. Only a connection for high-frequency will then exist between the ends of the inner conductor of a system of conductors.

The invention will be described in detail hereinafter with reference to the drawings, wherein.

Figure 1:
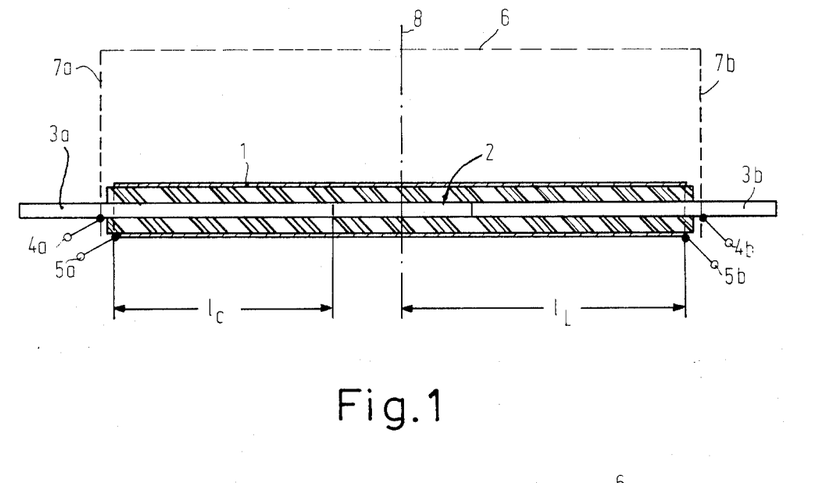
FIG. 1 is a side elevation of a system of conductors including a shield.
Figure 2:
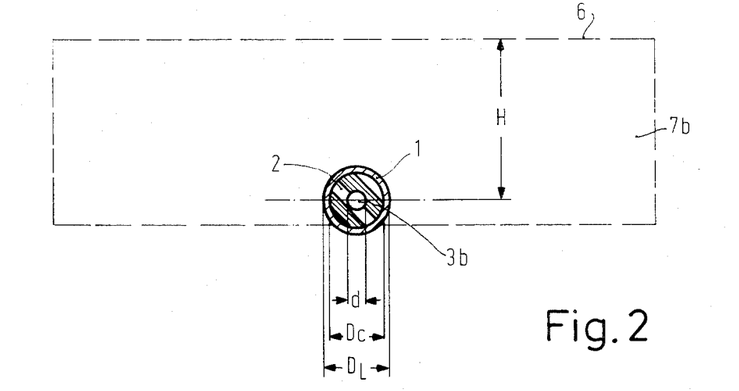
FIG. 2 is a cross-sectional view of the same system, taken perpendicularly to the axial direction of the system of conductors.

FIGS. 1 and 2 show an electrically conductive tube 1 having a length $2_L$, an outer diameter $D_L$ and an inner diameter $D_c$. The tube 1 forms the outer conductor of the system of conductors. Typical values for $D_L$ and $D_c$ are 12 mm and 10 mm, respectively. Inside the tube there is arranged a dielectric. For high resonant frequencies, a dielectric having a low, relative dielectric constant is chosen, for example teflon, while for low resonant frequencies a dielectric having a higher dielectric constant is chosen, for example aluminum oxide ceramic. The dielectric 2 is provided with a bore which is concentric with the outer conductor 1 and in which two inner conductors 3a and 3b are arranged so as to be displaceable, said inner conductors projecting from the ends of the outer conductor 1 which form the coupling apertures and penetrating the outer conductor 1 preferably equally far, the penetration depth being denoted by the reference $c$. In conjunction with a high-frequency or conductive connection of the projecting ends of the inner conductors 3a and 3b to be described hereinafter, there is obtained a system of conductors wherefrom a high-frequency coil system can be formed, using a single or a plurality of such systems of conductors.

In the system shown in the FIGS. 1 and 2, an electrically conductive shield 6 forms a conductive connection between the ends of the inner conductors 3a and 3b which project from the outer conductor 1. The shield 6 extends parallel to the outer conductor 1 at a distance H from the centre of the system of conductors and includes two end faces 7a and 7b which extend perpendicularly to the systems of conductors and which are electrically conductively connected, via a sliding contact (not shown), to the ends of the inner conductors 3a and 3b.

Figure 3:
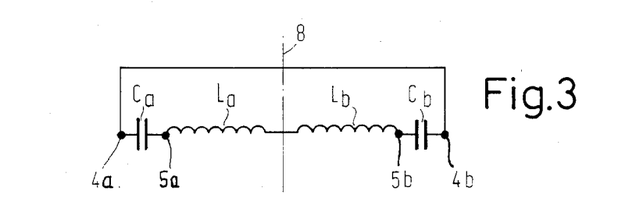
FIG. 3 shows the associated equivalent diagram.

FIG. 3 shows the equivalent diagram of the system of conductors. The connection points 4a and 4b are formed by the connection between the end faces 7a and 7b of the shield 6 and the inner conductors 3a and 3b, the connection points 5a and 5b being the ends of the outer conductor (see FIG. 1). The capacitors $C_a$ and $C_b$ represent the capacitances between the inner conductors 3a, 3b and the outer conductor 1, respectively. The stroke-dot line 8 in the FIGS. 1 and 3 represents a geometrical and electrical plane of symmetry and corresponds to a short-circuit plane (maximum value of the high-frequency current). The inductances $L_a$ and $L_b$ arise between the outer conductor and the shield on both sides of the plane of symmetry.

The resonant frequency of the system of conductors follows from $$f_{res} = 47.75 * [ln(D_c/d)/(ln(4H/D_L)*l_L*l_c*_r)]^{\frac{1}{2}} \quad (1)$$

in MHz, when $l_L$ and $l_c$ are expressed in meters and $_r$ is the relative dielectric constant of the dielectric 2.

For the coil lengths typically used for total body examinations in MRI apparatus (0.025 m $\leq 2l_L \leq$ 0.6 m) resonant frequency values of between 20 MHz and 200 MHz will be obtained for the dimensions $D_L$, $D_c$, d, H and $l_c$ which can be chosen at random within given limits as well as for dielectric materials having relative dielectric constants of between 1.5 and 9 (corresponding to Larmor frequencies of hydrogen protons of from 0.5 T to 5 T). Resonant frequencies of between 200 MHz and 600 MHz can be achieved by means of high-frequency coil systems in which the length of the systems of conductors amounts to from 10 cm to 20 cm. The length $2l_L$ of the outer conductor should always be smaller than one quarter wavelength for the relevant resonant frequency (in air). When the high-frequency shield 6 is formed by a copper foil and the outer conductor 6 is formed by a copper tube, typical quality factors will be between 1000 and 1500.

Resonant frequencies below 20 MHz for low-field systems or nuclei other than protons can be realized by means of a dielectric formed by barium titanates whose dielectric constant is between 20 and 90. Another possibility consists in that low-cross concentrated capacitors are connected parallel to the connection points 4a, 5a and 4b, 5b.

Figure 4A:
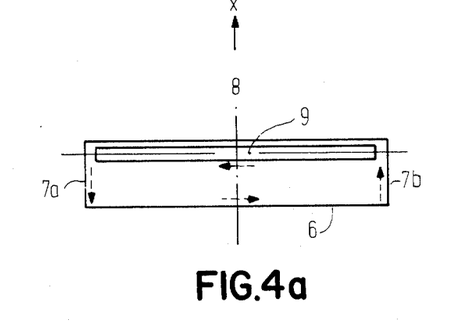
FIGS. 4a to 4c show a surface coil in three mutually perpendicular views.
Figure 4B:
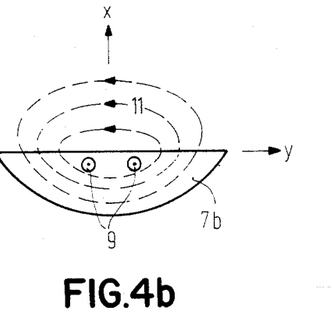

FIGS. 4a, b and c show a surface coil constructed in accordance with the described principle, that is to say in a side elevation, a front view and a plan view, respectively. The surface coil is comprised of an electric shield 6 and two systems of conductors. The two systems of conductors 9 extend in the z-direction of a cartesian system of coordinates xyz. The principal surface of the shield is not flat as in the FIGS. 1 and 2 but curved about an axis extending parallel to the z-axis; via its end faces 7a and 7b, the shield interconnects the ends of the inner conductors of each of the two systems of conductors. A bridge or strap 10 interconnects the ends of the two outer conductors facing the end face 7b and at the same time serves as the connection 5b, for example via a series-connected matching capacitor (not shown) to a high-frequency generator of a high-frequency receiving amplifier, generally via a coaxial cable whose other connections (ground) is connected to the shield or the point 4b. The current then occurring are denoted by arrows in the FIGS. 4a and 4c, the current flowing across the high-frequency shield being a surface current. FIG. 4b shows the resultant course of the magnetic field lines 11.

As a result of the number of parallel-connected systems of conductors, their arrangement inside the shield, and the shape of the shield, the profile of the high-frequency magnetic field can be formed in accordance with the relevant requirements. The high-frequency shield formed by the elements 6 and 7a, 7b can also be extended so as to cover areas over the system of conductors 9, thus forming a coil aperture which is preferably symmetrical with respect to the symmetry axis 8 and the z-axis and which is smaller than the projection area of the shield 6. The number of systems of conductors which are arranged parallel in space as well as electrically connected in parallel may vary between 1 and 6. Using a surface coil of the kind shown in the FIGS. 4a to 4c, large imaging surfaces of up to 40×50 cm$^2$ can be covered in the yz-plane in an magnetic resonance imaging apparatus. Because of the comparatively small deterioration of the high-frequency magnetic field (extending in the y-direction), using such a coil images up to a depth of 12 cm can be obtained in the x-direction in the xz-plane as well as in the xy-plane, the signal-to-noise ratio still being higher than in the case of a total-body coil.

Figure 4C:
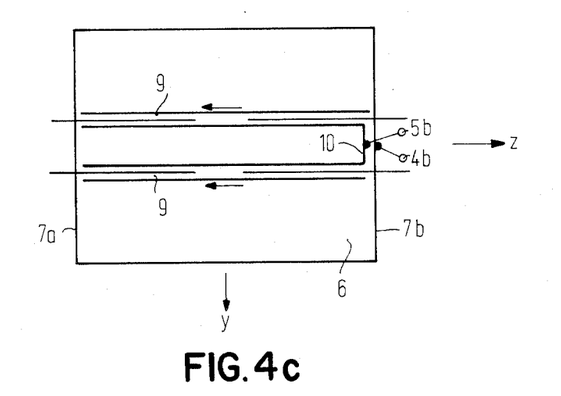
Figure 4D:
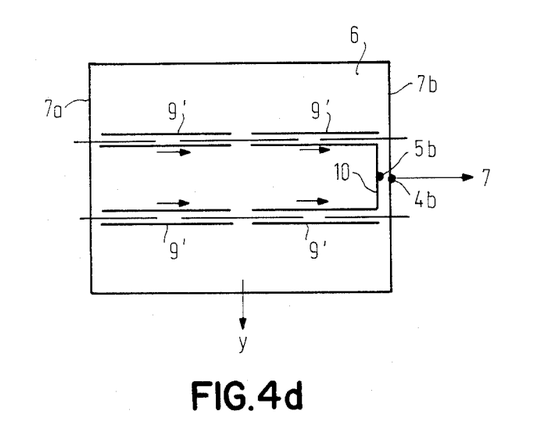
FIG. 4d is a plan view of a version which is based on this principle and which is suitable for high frequencies.

The embodiment shown in FIG. 4d deviates from that shown in FIGS. 4a to 4c in that each of the two systems of conductors 9 is replaced by two electrically series-connected systems of conductors 9', the facing inner conductors being replaced by a single inner conductor which penetrates the outer conductors of both systems of conductors. Tuning is realized by means of the ends of the relevant remaining inner conductor which project from the outer conductors and which are electrically conductively connected to the end faces 7a and 7b, respectively. Thus, the systems of conductors have a length which amounts to only half that of the systems shown in FIG. 4c, so that the inductances are also halved and also the high-frequency voltages or electric field strength occurring in the system of conductors with the same high-frequency current. When this surface coil is used in the vicinity of the body, the dielectric losses will be substantially lower during operation.

Figure 5:
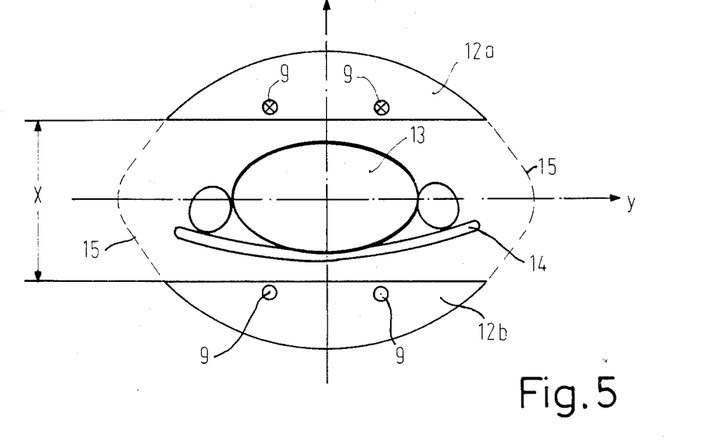
FIG. 5 shows a body coil which includes two electrically conductive shields.

Using a plurality of coils as shown in FIGS. 4a–4c or 4d, a coil can be formed which completely encloses the head or the body and which generates a uniform high-frequency magnetic field in a comparatively large region. FIG. 5 shows one such embodiment in this.

FIG. 5 shows two identically constructed subcoils 12a and 12b as shown in FIG. 4 which are symmetrically arranged with respect to the yz-plane, so that the systems of conductors 9 in the two sub-coils are arranged symmetrically with respect to the z-axis. The two surface coils 12a and 12b have been through an angle of 180° with respect to the z-axis. Accordingly, the systems of conductors 9 in the sub-coils 12a and 12b are also driven with a 180° phase shift with respect to one another, so that the current in the coil 12a will always flow in the opposite direction with respect to the current in the coil 12b. This electric phase shift can be realized in that the voltage of a high-frequency generator is applied directly to the terminals 4b and 5b of the sub-coil 12b and to the corresponding terminals of the sub-coil 12a via a lead whose length corresponds to one half wavelength for the relevant frequency.

When use is made of additional high-frequency shields 15 which electrically interconnect the shields of the two sub-coils 12a and 12b, the homogeneity of the high-frequency field generated thereby can be improved and external interference can be better suppressed. When the shields 15 are flexible, the distance X between the sub-coils can be adapted to the posture of the relevant patient by means of an adjustable mechanical device (not shown). Because the sensitivity of the coil increases as the distance X decreases, the highest possible signal-to-noise will thus be obtained for the region of the body examined.

The high-frequency coil system shown in FIG. 5 generates a magnetic field which extends in the y-direction. When this coil system is positioned with respect to the table top 14 (as shown in the drawing) so that the patient, having a generally elliptical body section, is exposed to the magnetic field which extends in the y-direction, lower high-frequency losses will be achieved and hence higher values of the quality factor than when the high-frequency field is directed anterior-posterior (i.e. in the x-direction).

As has already been explained with reference to FIGS. 4a to 4d, the number of systems of conductors 9 in the sub-coils 12a, 12b may be larger or smaller than 2. When this number is larger, a wider range of homogeneity of the high-frequency magnetic field will be obtained notably in the y-direction.

Figure 6:
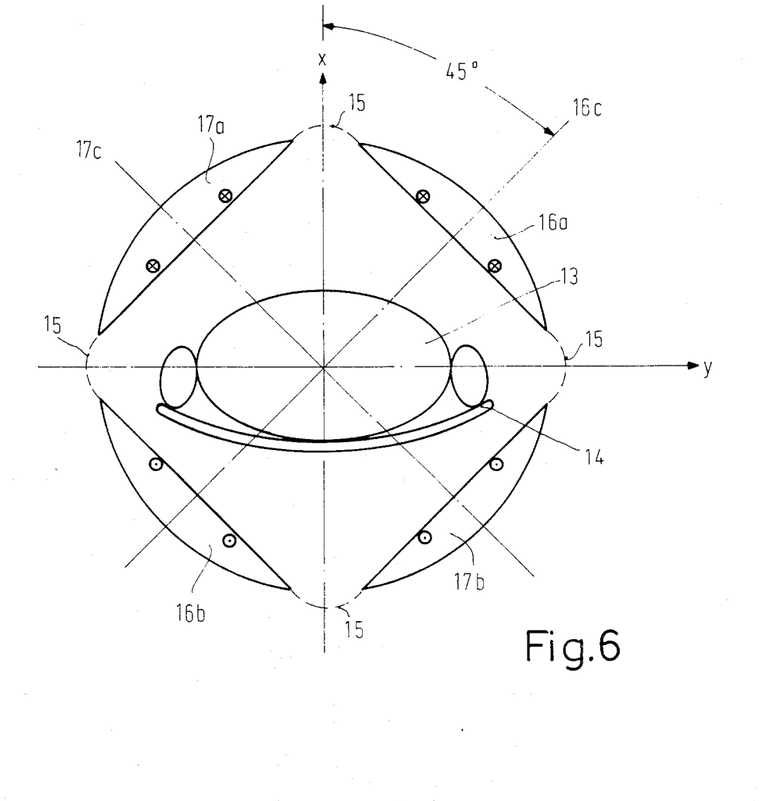
FIG. 6 shows a similar coil which includes four electrically conductive shields.

The high-frequency coil system shown in FIG. 6 is formed by four sub-coils 16a, 16b, 17a and 17b, which have been rotated each time through 90° with respect to one another about the z-axis and whose systems of conductors extend parallel to the z-axis. Each of these sub-coils has the construction shown in the FIGS. 4a and 4b.

As has already been explained with reference to FIG. 5, the facing coils, for example 16a and 16b or 17a and 17b, receive voltages which have been phase-shifted through 180° with respect to one another. However, the phase of the voltages of two adjacent sub-coils, for example 16b and 17b, is shifted 90° with respect to one another. Therefore, the high-frequency coil system shown in FIG. 6 generates a circularly polarized, high-frequency magnetic field, that is to say, a field which rotates about the z-axis and which extends perpendicularly to the z-axis.

As shown in the drawing, the symmetry planes 16c of the sub-coils 16a and 16b and 17c of the sub-coils 17a and 17b enclose an angle of 45° with respect to the table top 14. When the patient 13 is positioned thereon in the prone or the dorsal position, the two sub-coil systems 16a and 16b or 17a and 17b will be uniformly loaded, so that the circular polarization will be sustained. When the additional high-frequency shields 15 which interconnect the shields of the sub-coils 16a . . . . 17b are flexible, uniform loading can also be achieved by slightly tilting or shifting the sub-coils.

The foregoing description concerns the generating of high-frequency magnetic fields. However, coil systems of this kind can also convert high-frequency magnetic fields into electric signals. The signals generated by the individual sub-coils must then be superposed with the indicated phase-shift.

Figure 7:
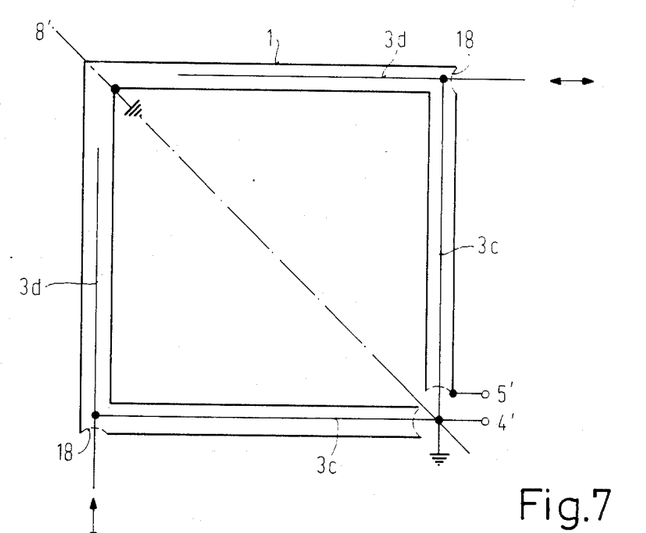
FIGS. 7 to 11 show various coil systems consisting of one or more systems of conductors.

In the high-frequency coil systems described thus far, the electrical interconnection of the ends of the inner conductors of a system of conductors is realized by means of a separate shield. However, this interconnection can also be realized by bending the system of conductors so as to form a round or rectangular (as shown in FIG. 7) loop, so that the ends of the outer conductors, forming the coupling apertures, directly adjoin one another. The ends of the inner conductors which project from these ends are directly interconnected and the connection point 4' and one end 5' of the outer conduction 1 form the connection points for the high-frequency generator or, when the coil is used as a receiving coil, for a receiver which processes the spin resonance signals induced in the coil. The inner conductors then consist of a section 3c which cannot be displaced inside the outer conductor 1 or the dielectric, the two sections being interconnected via a sliding contact. The sections 3c are arranged inside the legs of the outer conductor which adjoin the connection point 4', while the displaceable sections 3d are arranged inside the two other legs of the frame. At the area of the sliding contacts of the two inner conductors, these legs are provided with apertures 18 wherethrough the sections 3d can be displaced for the purpose of tuning.

When the system of conductors has been tuned to resonance, the diagonal 8' of the frame will form an electrical and geometrical plane of symmetry which correpsonds to a short-circuit plane so that it can be connected to ground.

Figure 8:
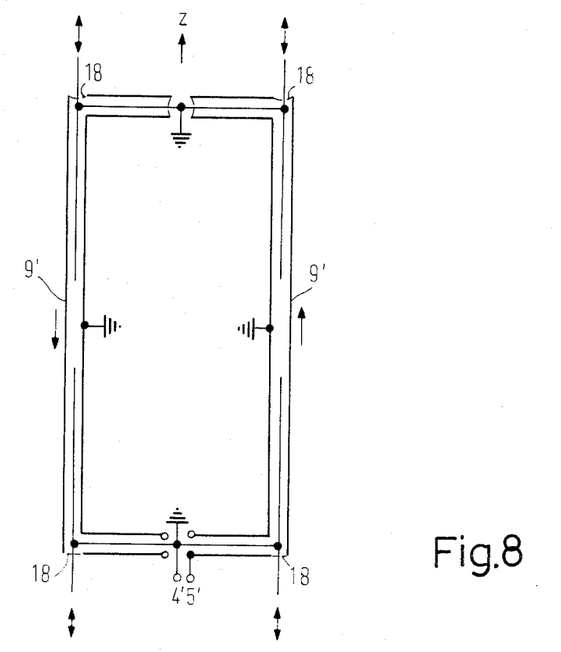

FIG. 8 shows a frame coil formed by two similar, U-shaped systems of condcutors whose inner conductors which project from the free ends are interconnected. One of the connection points 4' forms, together with the neighbouring end 5' of one of the two systems of conductors, the connection for a high-frequency generator or receiver. The inner conductor of each of the two systems of conductors again consists of a fixed section and a slidable section which are interconnected via a sliding contact; at the area of the sliding contacts the legs accommmodating the slidable sections are again provided with apertures 18 wherethrough these sections can be displaced in the direction of the arrow, that is to say in the direction of the legs.

The advantage of such a composite frame over the frame shown in FIG. 7 is that the dielectric losses are lower when the coil is used as a surface coil.

Figure 9A:
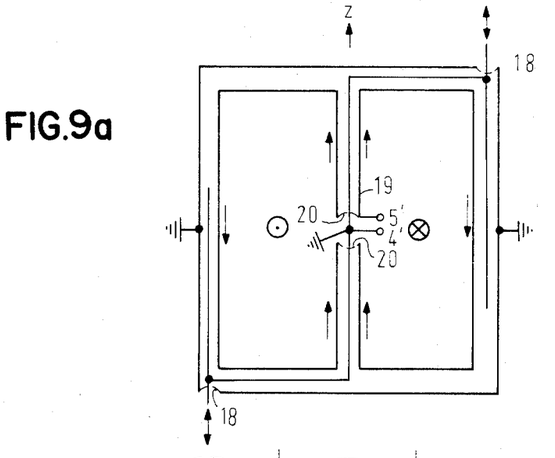
Figure 9B:
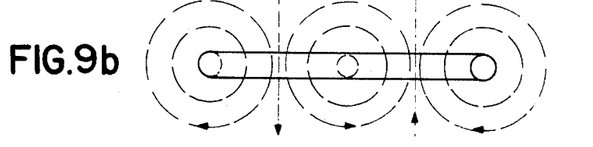

FIGS. 9a, b again show a coil which is formed by a single system of conductors but which, however, is sub-divided into two equal halves by means of a central leg 19, thus forming a double frame. The coupling apertures 20 are situated in the centre of the central leg, the connection point of the inner conductors projecting from the coupling apertures forming one connection while the end of the outer conductor of the central leg 19 forms the other connection 5' for a high-frequency generator. As a result, in the two frame halves there are generated currents which flow in opposite directions or magnetic fields which are perpendicular to the plane of the double frame and which have an opposed orientation. The inner conductors again consist of a section which cannot be displaced inside the outer conductor and a movable section which is connected thereto via a sliding contact and which can be displaced through suitably situated apertures 18. The oppositely oriented magnetic fields generated by the two coil halves compensate one another at a substantial distance from the coil plane. Thus, the resultant magnetic field, is limited to a small zone surrounding the coil. As a result, the damping of the coil resonance by high-frequency losses in the body tissues is reduced and a better signal-to-noise ratio is obtained when the frame is used as a surface coil for receiving spin resonance signals.

A further advantage of this coil is obtained when the coil is used for receiving spin resonance signals excited by the uniform high-frequency magnetic field of a transmitter coil. In that case it is an advantage that the signals induced by the two halves of the receiving coil compensate one antoehr, so that the receiving coil will always be uncoupled from the transmitter coil.

Figure 10:
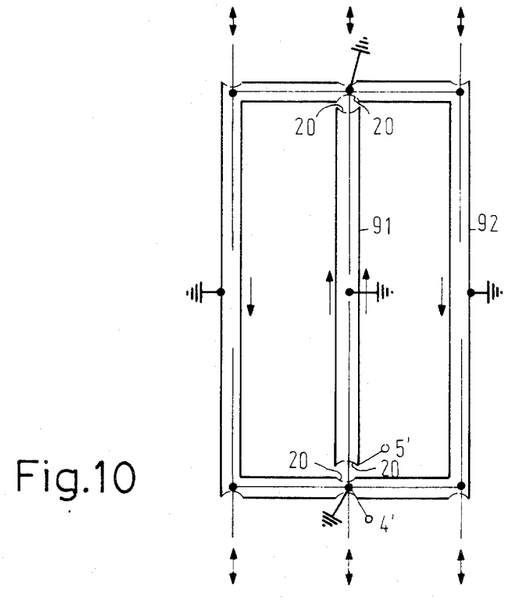

The high-frequency coil shown in FIG. 10 again forms a double frame, but consists of two systems of conductors. One system of conductors 91 forms the central leg while the other, rectangularly shaped system of conductors 92 forms the frame which is provided with coupling apertures 20 at the area of the ends of the central leg. At that area the inner conductors of the system of conductors 91 forming the central leg are connected to the inner conductors of the system of conductors 92 forming the frame. One of the two connection points 4' and the neighbouring end 5' of the outer conductor of the system of conductors 91 serves for supplying and deriving the high-frequency signals. In the case of resonance, current maxima will occur in the centre of the central leg 91 and in the centre of the legs of the system of conductors 92, so that these points may be grounded.

Figure 11:
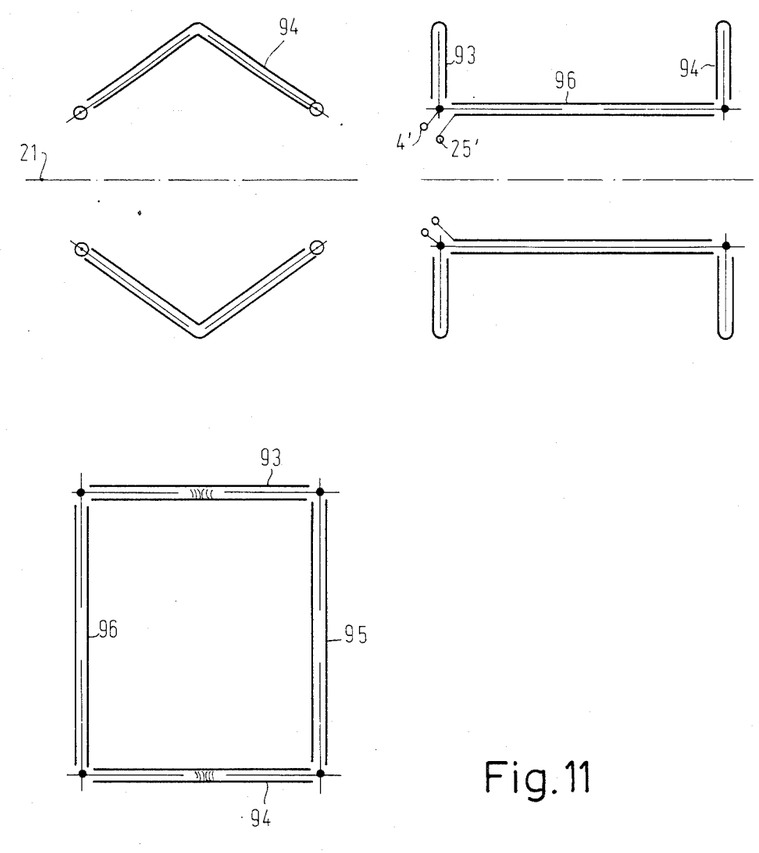

The front view, side elevation and plan view of the embodiment shown in FIG. 11 illustrate that a saddle-shaped coil can also be formed from the systems of conductors. The saddle-shaped coil is formed by two identically constructed halves which are symmetrically arranged with respect to a plane 21. Each half consists of four systems of conductors. The two systems of conductors 95, 96 are linear, have the same length and are arranged parallel to one another and to the symmetry plane 21. The systems of conductors 93 and 94 are also identical, but are accutely bent in the centre. The inner conductor ends projecting therefrom are connected to the inner conductor ends of the legs 95 and 96, so that the coil halves thus formed resemble the contours or a saddle. The supply of extraction of high-frequency signals is again realized between one of the connection points 4' of the inner conductors and the neighbouring end 25 of the outer conductor. The lower coil half is powered at the same location, so that the high-frequency current through the associated legs of the lower coil half, arranged symmetrically with respect to the plane 21, will always flow in the same direction.

When each of the systems of conductors is tuned to the same resonant frequency, current maxima will occur each time in the centre of the outer conductors as well as at all connection points (corresponding to 4') of the inner conductors projecting from the outer conductors. Therefore, these points may be grounded. Because of the many ground points of a saddle-shaped coil thus constructed, only comparatively low electric field strengths will occur inside the coil and hence also comparatively low dielectric losses.

For operation of a coil system which is comprised of several systems of conductors, for example the coil system shown in FIGS. 5, 6 or 11, all systems of conductors must be tuned to the same resonant frequency. When an MRI examination is to be performed and a patient is present in the vicinity of the coil system, slight detuning will occur. Such detuning, however, can be eliminated by readjustment of only one of the systems of conductors.

What is claimed is:

1. A high-frequency coil system for a magnetic resonance imaging apparatus, said coil system comprising a system of conductors having a hollow, cylindrical outer conductor with two coupling apertures, a dielectric disposed within said outer conductor and at least two inner conductors arranged inside said dielectric for displacement with respect to said outer conductor and means for interconnecting said at least two inner conductors so that a high frequency current will flow between said outer conductor and at least one of said inner conductors via capacitance between said at least one inner conductor and said outer conductor.

2. A high-frequency coil system as claimed in claim 1, wherein each of said two coupling apertures is formed by a respective one of two opposite ends of said outer conductor and wherein each of said at least two inner conductors projects from a respective one of said coupling apertures and wherein said interconnecting means includes an electrically conductive shield which is electrically connected to portions of said inner conductors which extend through said apertures.

3. A high-frequency coil system as claimed in claim 1 including a plurality of said systems of conductors and means for electrically connecting said systems of conductors in series.

4. A high-frequency coil system as claimed in claim 3 wherein said outer conductors of said systems of conductors are interconnected by an electrically conductive strap.

5. A high-frequency coil system as claimed in claim 4, wherein said interconnection means includes an electrically conductive shield which is electrically connected to said inner conductors of a respective system of conductors.

6. A high-frequency coil system as claimed in claim 1, including a plurality of said systems of conductors and means for electrically connecting said systems in parallel.

7. A high-frequency coil system as claimed in claim 2, wherein said inner conductors extend parallel to the axis of said cylindrical outer conductor, said outer conductor being parallel to a side face of said shield, said shield having two end faces which are disposed opposite each other and which are generally perpendicular to the axis of said outer conductor, each of said inner conductors being connected to a respective one of said end faces.

8. A high-frequency coil system as claimed in claim 7, including a plurality of said systems of conductors, said outer conductors and associated shields of said systems of conductors being arranged symmetrically about a central axis which is parallel to the axes of said outer conductors.

9. A high-frequency coil system as claimed in claim 8, having an even number of said systems of conductors.

10. A high-frequency coil system as claimed in claim 1, wherein said system of conductors forms a rectangle arranged so that said two coupling apertures are adjacent each other, said inner conductors having end portions which project from respective coupling apertures and wherein said interconnecting means interconnects said projecting portions of said inner conductors.

11. A high-frequency coil system as claimed in claim 1, including a plurality of said systems of conductors and means for interconnecting each inner conductor of one system of conductors to a respective one of said inner conductors of another system of conductors.

12. A high-frequency coil system as claimed in claim 11, wherein said systems of conductors are arranged so as to form a rectangle.

13. A high-frequency coil system as claimed in claim 10 wherein said system of conductors is arranged so as to form a symmetrical double frame comprised of two sub-frames having a common side such that currents in said outer conductor forming opposite sides of said sub-frames flow in opposite directions.

14. A high-frequency coil system as claimed in claim 12 wherein one of said systems of conductors extends between opposite sides of said rectangle so as to form a symmetrical pair of sub-frames with said one system of conductors forming a common side thereof such that currents in outer conductors forming opposite sides of said sub-frames flow in opposite directions.

15. A high-frequency coil system as claimed in claim 1 wherein said outer conductors is acutely bent.

16. A high-frequency coil system as claimed in claim 10 wherein at least one of said inner conductors is comprised of two sections one of which is fixed and the other displaceable with respect to said outer conductor.

* * * * *

UNITED STATES PATENT AND TRADEMARK OFFICE
CERTIFICATE OF CORRECTION

PATENT NO. : 4,746,866
DATED : May 24, 1988
INVENTOR(S) : Peter K.H. Roschmann

It is certified that error appears in the above-identified patent and that said Letters Patent is hereby corrected as shown below:

IN THE CLAIMS

Claim 5, line 2  change "interconnection" to --interconnecting--

Claim 15, line 2  change "conductors" to --conductor--

Signed and Sealed this

Twenty-eighth Day of March, 1989

*Attest:*

DONALD J. QUIGG

*Attesting Officer*   *Commissioner of Patents and Trademarks*